(12) United States Patent
Bellaouar

(10) Patent No.: US 6,249,240 B1
(45) Date of Patent: Jun. 19, 2001

(54) SWITCHED-CAPACITOR CIRCUITRY WITH REDUCED LOADING UPON REFERENCE VOLTAGES

(75) Inventor: Abdellatif Bellaouar, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/369,112

(22) Filed: Aug. 5, 1999

Related U.S. Application Data

(60) Provisional application No. 60/098,334, filed on Aug. 28, 1998.

(51) Int. Cl.[7] ................................................ H03M 1/12
(52) U.S. Cl. ............................................ 341/172; 341/155
(58) Field of Search .................................. 341/172, 155, 341/150, 161; 330/9

(56) References Cited

U.S. PATENT DOCUMENTS

| | | | |
|---|---|---|---|
| 4,237,390 | 12/1980 | Buurma | 307/362 |
| 5,187,390 | 2/1993 | Scott, II | 307/353 |
| 5,351,050 | 9/1994 | Thompson et al. | 341/143 |
| 5,574,457 | 11/1996 | Garrity et al. | 341/172 |
| 5,644,257 | 7/1997 | Kerth et al. | 327/96 |
| 5,689,206 | * 11/1997 | Schaller | 327/337 |

OTHER PUBLICATIONS

"A 10–b 20–Msample /s Analog–to–Digital Converter", Lewis, et al., IEEE Journal of Solid State Circuits, vol. 27, No. 3, 03/92, pp. 351–358.

* cited by examiner

Primary Examiner—Peguy JeanPierre
(74) Attorney, Agent, or Firm—J. Dennis Moore; W. James Brady, III; Frederick J. Telecky, Jr.

(57) ABSTRACT

A switched-capacitor circuit (35), and analog-to-digital converter (50) incorporating the same, is disclosed. The disclosed switched-capacitor circuit (35) receives differential input signal voltages ($V_{in}^+$, $V_{in}^-$), and differential reference voltages ($V_{refp}$, $V_{refn}$), based upon which differential output voltages ($V_{out}^+$, $V_{out}^-$) are generated by way of sample-and-hold, and amplify, operations. In a larger context, such as in a pipelined ADC (50), multiple switched-capacitor circuits (35) are implemented, each receiving the differential reference voltages ($V_{refp}$, $V_{refn}$) from a voltage reference circuit (20). In addition to the sample clock ($\phi_1$) and amplify clock ($\phi_2$), a precharge clock ($\phi_2$') is provided to the switched-capacitor circuit (35) to connect the sample nodes ($V_A$, $V_B$) of the switched-capacitor circuit (35) to a midlevel voltage ($V_{mid}$), prior to the active phase of a reference clock ($100_2$") connecting the sample nodes ($V_A$, $V_B$) to the reference voltages ($V_{refp}$, $V_{refn}$). As a result, the loading presented by the switched capacitor circuits (35) to the voltage reference circuit (20) is greatly reduced.

20 Claims, 4 Drawing Sheets

SWITCHED-CAPACITOR CIRCUITRY WITH REDUCED LOADING UPON REFERENCE VOLTAGES

This application claims priority under 35 USC § 119(e)(1) of provisional application No. 60/098,334, filed Aug. 28, 1998.

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

This invention is in the field of analog circuitry, and is more specifically directed to switched-capacitor circuits.

In the field of analog circuits, such as implemented in modem analog and mixed-signal (i.e., containing both digital and analog functions) integrated circuits, switched-capacitor techniques are utilized in many applications. In general, switched-capacitor circuits operate by periodically connecting an input voltage to a capacitor, which in turn stores a charge corresponding to the applied voltage. The capacitor is subsequently connected to an input of an amplifier or other circuit to communicate the input voltage to downstream circuitry. As such, sample-and-hold functions are commonly realized by way of switched-capacitor techniques.

One important application of switched-capacitor techniques is the comparison of an input signal voltage to a reference voltage. In this application, the sampling capacitor is initially connected to a reference voltage, such as may be generated by a band-gap voltage reference circuit or similar circuit for generating a reference voltage that is relatively stable over variations in power supply voltage, temperature, and manufacturing process parameters. The capacitor is then switchably connected to receive a signal input voltage, such that the resulting charge on the capacitor corresponds to the differential between the signal input voltage and the reference voltage. This resulting charge can then be sensed by an amplifier, which in turn generates a signal corresponding to that differential. The reference voltage is then again connected to the sampling capacitor in preparation for the next sample of the input voltage.

This switched-capacitor comparator function is commonly used in many integrated circuit applications. One important use of this function is in pipelined analog-to-digital converter circuits (ADCs), an example of which is presented, in block diagram form, as ADC 10 of FIG. 1. As illustrated therein, ADC 10 receives an analog input voltage on line $V_{IN}$ and generates, at its output, an n-bit digital word on lines $V_{OUT}$ that correspond to the input analog voltage. To accomplish this function, ADC 10 includes a series of analog stages $4_0$ through $4_k$. First stage $4_0$ receives the analog input voltage on line $V_{IN}$ and, based on the amplitude of this input voltage, generates an m-bit digital output on lines $D_0$ and a residue output on lines $RES_0$. Typically, the number of digital bits m generated by each stage 4 is 2 or more. The residue voltage on line $RES_0$ corresponds to a remainder of the "division" carried out in the digitization operation. As shown in FIG. 1, each subsequent, lower-order, stage $4_j$ (from the set of stages $4_1$ through $4_k$) receives the residue voltage on lines $RES_{j-1}$ from the previous stage $4_{j-1}$, and similarly generates m digital output bits on lines $D_j$, and a residue analog voltage on line $RES_j$ that is forwarded to the next stage $4_{j+1}$ in the pipeline.

The digital results of each stage $4_j$ are stored in corresponding latch $6_j$, the contents of which are summed, by adder $8_j$, with the digital result on lines $D_{j+1}$ from the next stage $4_{j+1}$ in the sequence; the output of the final adder $8_k$ is the n-bit digital output word on lines $V_{OUT}$. The pipelining effect of ADC 10 is enabled by the operation of latches 6; once a stage $4_j$ derives a digital result and residue, it can begin conversion of the next sample in time while the next stage $4_{j+1}$ operates on the result from the previous sample. As such, each of the multiple stages 4 in ADC 10 can be operating on different samples of the input signal voltage $V_{IN}$, with a sequence of digital results generated by final adder $8_k$.

FIG. 2 illustrates the functional construction of exemplary analog stage $4_j$ in ADC 10 of FIG. 1. As shown in FIG. 2, input voltage $V_{in}$ is applied to sub-ADC 5, which produces the digital output on lines $D_j$; these digital outputs are also applied to sub-DAC 7, which presents an analog signal to subtractor 9. Subtractor 9 subtracts the output from sub-DAC 7 from the value of input voltage $V_{in}$, sampled and held by sample-and-hold circuit 3; the output of subtractor 9 is amplified by gain amplifier 11 to generate analog residue voltage on line $RES_j$ that is within a voltage range suitable for use by a next, downstream, analog stage $4_{j+1}$.

In typical modern pipelined ADCs, certain of the functions of each stage 4 are combined into single circuits, which may be realized according to switched-capacitor techniques. An example of such a conventional modern pipelined ADC may be found in Lewis, et al., "A 10-b 20 Msample/s Analog-to-Digital Converter", J. Solid State Circ., Vol. 27, No. 3 (IEEE, March 1992), pp. 351–58. As described therein, the functions of sample-and-hold 3, subtractor 9, sub-DAC 7, and amplifier 11 may be combined into a switched-capacitor amplifier circuit that operates upon differential input voltages, and a comparison against two reference voltage levels. In the ten-bit case of the Lewis, et al. article, each of nine stages receives two reference voltage levels at switched-capacitor inputs. As exemplified in the Lewis, et al., article, and as is known in the art, switched-capacitor pipelined ADC circuits provide excellent resolution at extremely high conversion rates, considering the pipelined architecture of the ADC.

Of course, as is known in the art, ADCs of 14-bit and 16-bit precision are now commonly used, with even higher precision ADCs expected in the near future. According to the typical switched-capacitor architecture, as described in the Lewis et al. article and as will now be described relative to FIG. 3, each switched-capacitor stage of the ADC performs a comparison of sampled differential input voltages, pre-charging sample nodes to reference voltages before each sample of the differential input signal. Accuracy in this comparison requires, of course, reference voltages that are not only stable over variations in power supply voltage, temperature, and manufacturing process parameters, but is also stable considering the switching operation of the ADC.

FIG. 3 illustrates an example of conventional differential switched-capacitor stage $15_j$ as may be used in modem pipelined ADCs and other circuits that utilize switched-capacitor comparisons. For purposes of clarity, conventional devices that are commonly included to minimize charge injection current and apply precharge voltages at certain circuit nodes are not shown in FIG. 3. In this example, switched-capacitor stage $15_j$ receives a differential input voltage on lines $V_{in}^+$ and $V_{in}^-$, and two reference voltage levels $V_{refp}$ and $V_{refn}$. In operation, switched-capacitor stage $15_j$ compares the voltage on line $V_{in}^+$ with the voltage on line $V_{in}^-$, after precharging respective capacitor inputs to reference voltages $V_{refp}$, $V_{refn}$. Reference voltages $V_{refp}$ and $V_{refn}$ are generated by reference voltage circuit 20 which includes, in this conventional example, bandgap circuit 12 for generating a voltage on line $V_r$ that is stable over variations in power supply voltage, temperature, and manufacturing process parameters. Various implementations of bandgap circuit 12 are well known in the art. Line $V_r$, in this example, is applied to an inverting input of operational amplifier 14, which has its non-inverting input biased to ground. According to conventional circuit techniques, the resistive input and feedback arrangement of amplifier 14, in combination with the capacitive coupling of the inverting and non-inverting outputs as illustrated, provide reference voltages $V_{refp}$ and $V_{refn}$ to switched-capacitor stage $15_j$ and other similar stages (not shown) which remain stable over various parameter variations as noted above.

Switched-capacitor stage $15_j$ includes a differential operational amplifier 16 which, as will now be described, generates a differential voltage on lines $V_{out}^+$ and $V_{out}^-$ in response to a switched-capacitor comparison of the voltages on lines $V_{in}^+$ and $V_{in}^-$. In this regard, input voltage $V_{in}^+$ is coupled to node $V_A$ at sample-and-hold capacitor CIN+ by way of switch 17+, and is coupled to feedback capacitor CFB+ by way of switch 18+. Each of switches 17+, 18+, as well as the other switches 17, 18, 19, 21 in switched-capacitor stage $15_j$ are conventional passgates, such as n-channel MOS transistors, or parallel CMOS transistors receiving complementary signals at their gates, as well known in the art.

As shown in FIG. 3, each of switches 17+, 18+ are controlled by clock $\phi_1$, which is the sample clock in this arrangement. Reference voltage $V_{refp}$ is coupled to node $V_A$ at sample-and-hold capacitor CIN+ by way of switch 19+, which is controlled by amplify clock $\phi_2$. Clock $\phi_2$ also controls, via switch 21+, the coupling of feedback from the non-inverting output of amplifier 16 to the inverting input thereof through feedback capacitor CFB+.

Similarly, the inverting input of amplifier 16 is connected to sample-and-hold capacitor CIN−, the opposite plate of which is coupled, at node $V_B$, to input voltage $V_{in}^-$ through switch 19−, and to reference voltage $V_{refn}$ through switch 19−. The inverting input of amplifier 16 is also connected to one plate of feedback capacitor CFB−. The opposite plate of feedback capacitor CFB− is coupled to input voltage $V_{in}^-$ via switch 18− and, through switch 21−, to line $V_{out}^-$ at the inverting output of amplifier 16. Switches 17− and 18− are controlled by sample clock $\phi_1$ while switches 19− and 21− are controlled by amplify clock $\phi_2$.

Sample clock $\phi_2$ and amplify clock $\phi_2$ are non-overlapping clock phases of the same frequency. In operation, sampling is effected by switched-capacitor stage $15_j$ upon sample clock $\phi_1$ being driven active (amplify clock $\phi_2$ inactive at this time); during this phase, nodes $V_A$, $V_B$ receive input voltages $V_{in}^+$, $V_{in}^-$, through switches 17+, 17−, respectively; these input voltages $V_{in}^+$, $V_{in}^-$ are also respectively applied to feedback capacitors CFB+, CFB− through switches 18+, 18−. During amplify clock phase $\phi_2$ becoming active (sample clock $\phi_1$ being inactive), switches 21+, 21− apply feedback from output lines $V_{out}^+$, $V_{out}^-$, respectively, to their respective feedback capacitors CFB+, CFB−, so that amplification is carried out by amplifier 16 according to the appropriate desired characteristics. In preparation for the next sample-and-hold operation, reference voltages $V_{refp}$, $V_{refn}$ are applied to nodes $V_A$, $V_B$, respectively, through respective switches 19+, 19− during this active phase of amplify clock $\phi_2$, such that the next samples of input voltages $V_{in}^+$, $V_{in}^-$ are accurately obtained (and their differential accurately compared against the reference voltage differential $V_{refp}$–$V_{refn}$), independently from the voltage of the prior sample. The operation then repeats, in the next cycles of sample clock $\phi_1$ and amplify clock $\phi_2$, to obtain and amplify the next sample of input voltages $V_{in}^+$, $V_{in}^-$.

It is contemplated that conventional switched-capacitor circuits, such as switched-capacitor stage $15_j$ of FIG. 3, present substantial load upon the reference voltages generated by reference voltage circuit 20 of FIG. 3. This load is, of course, exacerbated in circuits such as pipelined ADCs, where multiple switched-capacitor stages (up to sixteen such stages, in typical high-resolution ADC examples) receive the reference voltages and simultaneously switch their inputs. Because of this load, and the switching operations that such conventional circuits perform, the stability of the reference voltage can be compromised.

Referring now to FIG. 4, a worst-case example of reference voltage variations, as caused by switched-capacitor circuits such as switched-capacitor stage $15_j$ of FIG. 3, will now be described. In this example, the circuit of FIG. 3 was simulated, in a case where the total load presented by the switched capacitors in switched-capacitor stage $15_j$ was on the order of tens of picofarads. In the example illustrated in FIG. 4, an initial condition was established (i.e., prior to time t=0) by simulated operation of switched-capacitor stage $15_j$ for several cycles at a clock frequency ($\phi_1$, $\phi_2$) of 5 MHz using a minimum power supply voltage of 3 volts, and with input voltage $V_{in}^+$ set equal to reference voltage $V_{refn}$, and input voltage $V_{in}^-$ set equal to reference voltage $V_{refp}$ (i.e., each input voltage at its opposite state). This operation corresponds to the largest capacitor voltage swings at sample-and-hold capacitors CIN+, CIN−. At time $t_0$, new samples are obtained with input voltage $V_{in}^+$ set equal to reference voltage $V_{refp}$, and input voltage $V_{in}^-$ set equal to reference voltage $V_{refn}$. As evident from FIG. 4, the reference voltage differential $V_{refp}$–$V_{refn}$ modulates, in this condition, to a lower voltage from that at time t=0, differing therefrom by about 90 microvolts. After the reference voltage differential $V_{refp}$–$V_{refn}$ stabilized, this simulation reverted the input voltages to their initial state, with input voltage $V_{in}^+$ set equal to reference voltage $V_{refn}$, and input voltage $V_{in}^-$ set equal to reference voltage $V_{refp}$. The reference voltage differential $V_{refp}$–$V_{refn}$ does not remain at the lower voltage, however, but instead returns to its higher level, approximately equal to its level at time t=0. The actual reference voltage differential $V_{refp}$–$V_{refn}$ will, in practice, vary within these worst case limits of FIG. 4.

As evident from this simulation, the reference voltage differential $V_{refp}$–$V_{refn}$ varies according to the value of the input voltages $V_{in}^+$, $V_{in}^-$, due to the loading presented by switched-capacitor stage $15_j$, and the charge sharing between sample-and-hold capacitors CIN+, CIN− and the capacitors in reference voltage circuit 20. This dependence on input voltage is, of course, undesirable in applications such as ADCs, where accuracy in measurement of the input voltage is of highest importance. While variations of on the order of 90 microvolts are within the tolerance of some applications, such variations are not acceptable for high precision ADCs; indeed, the stability of reference voltages can limit the precision (i.e., number of bits) of the ADC itself. Conversely, improved stability of reference voltages can enable the construction and accurate operation of ADC circuits with additional bits of precision.

BRIEF SUMMARY OF THE INVENTION

It is therefore an object of the present invention to provide a switched-capacitor circuit that presents reduced switching load to the reference voltages applied thereto.

It is a further object of the present invention to provide such a circuit that may be readily implemented in switched-capacitor circuits with minimal overhead.

It is a further object of the present invention to provide a pipelined ADC including multiple ones of such switched-capacitor circuits, such an ADC having improved precision over conventional ADC circuits.

Other objects and advantages of the present invention will be apparent to those of ordinary skill in the art having reference to the following specification together with its drawings.

The present invention may be implemented in a switched-capacitor circuit having an amplifier with at least one input coupled, by way of a sample-and-hold capacitor, to switches through which an input voltage and a reference voltage are applied in non-overlapping sample and reference clock phases, respectively. The circuit also includes another switch through which a midlevel voltage is applied to the sample-and-hold capacitor during a third non-overlapping phase between the sample and reference clock phases. The application of the midlevel voltage limits the worst case loading presented to the reference voltage, thus limiting variations in the reference voltage as a result of input switching. When implemented into a pipelined ADC, the reduced reference voltage variations enable additional bits of precision in the analog-to-digital conversion.

DETAILED DESCRIPTION OF THE INVENTION

As will become apparent to those skilled in the art having reference to the following description, the present invention may be implemented according to many alternative realizations and applications. In this regard, while the preferred embodiment of the invention will be described hereinbelow relative to a differential switched-capacitor circuit, it is contemplated that the present invention may be realized in switched-capacitor circuits having single-ended inputs. Furthermore, while it is contemplated, as described hereinbelow, that the present invention is of particular benefit in circuits having several to many switched-capacitors stages, such circuits including pipelined analog-to-digital converters (ADCs), other applications of the present invention may also benefit from the present invention. It is therefore contemplated that such alternative realizations and applications will be within the scope of the present invention, as claimed hereinbelow.

Figure 5:
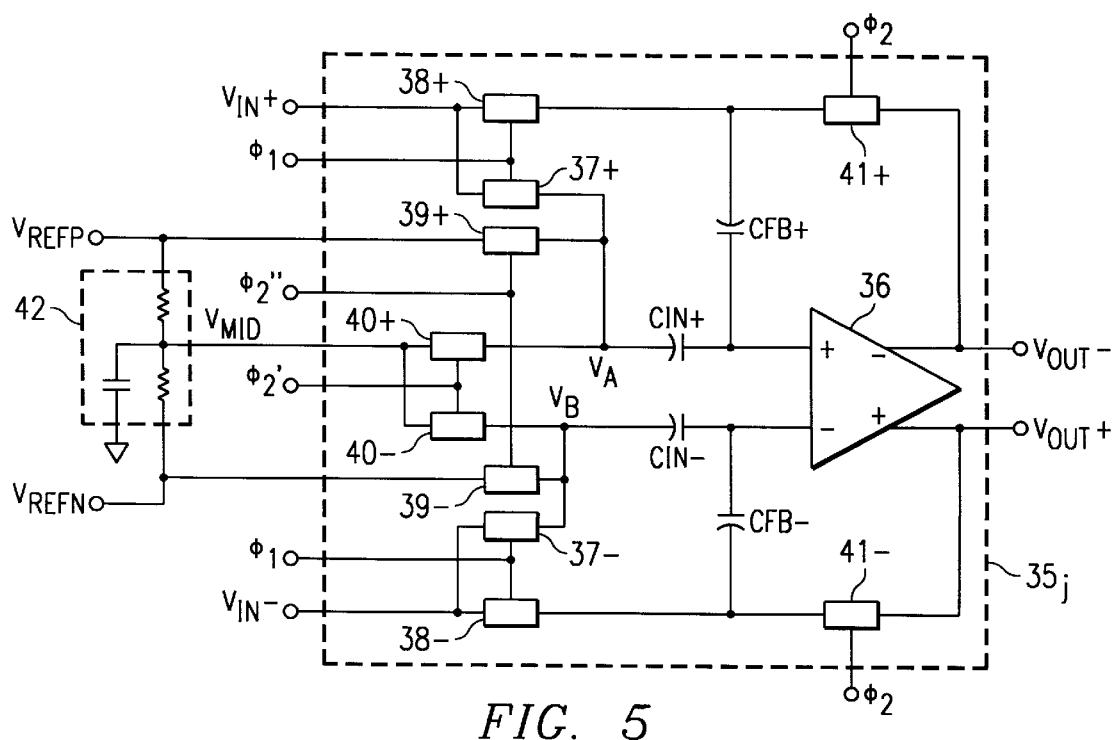
FIG. 5 is an electrical diagram, in schematic form, of a differential switched-capacitor stage according to the preferred embodiment of the invention.

Referring first to FIG. 5, the construction of differential switched-capacitor stage $35_j$ according to the preferred embodiment of the present invention will now be described in detail. According to the preferred embodiment of the invention, differential switched-capacitor stage $35_j$ includes differential operational amplifier 36, having inverting and non-inverting inputs, and inverting and non-inverting outputs, and which is capacitively coupled to input voltages (and with capacitive feedback) so as to operate as a differential sample-and-hold amplifying circuit stage.

The non-inverting input of amplifier 36 is connected to one plate of sample-and-hold capacitor CIN+, and to one plate of feedback capacitor CFB+. The opposite plate of sample-and-hold capacitor CIN+ at node $V_A$ is coupled to input voltage $V_{in}^+$ through switch 37+, and to reference voltage $V_{refp}$ through switch 39+. The plate of feedback capacitor CFB+ opposite that of the non-inverting input of amplifier 36 is coupled to input voltage $V_{in}^+$ through switch 38+, and to the non-inverting output of amplifier 36 at line $V_{out}^-$ through switch 41+. Switches 37+, 38+, 39+, 41+ are all implemented as conventional passgates (e.g., CMOS or NMOS passgates). In this embodiment of the invention, switches 37+, 38+ are controlled by sample clock $\phi_1$, and switch 41+ is controlled by amplify clock $\phi_2$. Further, switch 39+ is controlled by reference voltage clock $\phi_2''$ which, as will be described in detail below, is driven active during a latter portion of the active phase of amplify clock $\phi_2$.

The inverting input of amplifier 36 is similarly connected to one plate of sample-and-hold capacitor CIN-, and to one plate of feedback capacitor CFB-. The opposite plate of sample-and-hold capacitor CIN- at node $V_B$ is coupled to input voltage $V_{in}^-$ through switch 37-, and to reference voltage $V_{refn}$ through switch 39-, while the opposite plate of feedback capacitor CFB- is coupled to input voltage $V_{in}^-$ through switch 38-, and to the inverting output of amplifier 36 at line $V_{out}^+$ through switch 41-. Identically as noted above for switches 37+, 38+, 39+, 41+, switches 37-, 38-, 39-, 41- are all conventional passgates, implemented either as single transistors are as CMOs passgates. Also similarly to the switches 37+, 38+, 39+, 41+ associated with the non-inverting input of amplifier 36, switches 37-, 38- are controlled by sample clock $\phi_1$, switch 39- is controlled by reference clock $\phi_2''$, and switch 41- is controlled by amplify clock $\phi_2$.

According to the preferred embodiment of the invention, reference voltages $V_{refp}$, $V_{refn}$ define the extremes of the voltage range over which the input voltages $V_{in}^+$, $V_{in}^-$ may vary. For example, in the case where input voltages $V_{in}^+$, $V_{in}^-$ may vary from 0.5 volts to 2.5 volts, reference voltage $V_{refp}$ will be at approximately 2.5 volts, and reference voltage $V_{refn}$ will be at approximately 0.5 volts. Of course, the particular voltage range of input voltages $V_{in}^+$, $V_{in}^-$ and reference voltages $V_{refp}$, $V_{refn}$ will vary according to the particular application.

According to the preferred embodiment of the invention, nodes $V_A$ and $V_B$ are each also coupled to a third voltage $V_{mid}$, by way of switches 40+, 40−, respectively. Voltage $V_{mid}$ is preferably a voltage at a level between reference voltages $V_{refp}$, $V_{refn}$; however, this voltage $V_{mid}$ may be unregulated, as its specific level is not critical to operation. In this example, voltage divider 42 is provided to generate voltage $V_{mid}$ from reference voltages $V_{refp}$, $V_{refn}$ themselves, by way of a conventional resistor divider connected in series between reference voltages $V_{refp}$, $V_{refn}$, with a stabilizing capacitor connected between its output and ground. Alternatively, voltage $V_{mid}$ may be generated from a voltage division of power supply voltage $V_{dd}$ and ground, or as a third reference voltage from a voltage generator circuit as known in the art. As will become apparent from the following description, however, the actual level of voltage $V_{mid}$ need not be is not critical, and as such need not be precisely generated or regulated.

According to the preferred embodiment of the invention, voltage $V_{mid}$ is selected to be about the midlevel voltage between the reference voltage received at a particular input, and the opposite extreme of the input signal applied to that same input. Of course, in the differential switched-capacitor case described herein, voltage $V_{mid}$ may be selected to a voltage that is approximately midway between the extremes of the range of input voltages $V_{in}^+$, $V_{in}^-$, these extremes defined by reference voltages $V_{refp}$, $V_{refn}$. For the above example in which input voltages $V_{in}^+$, $V_{in}^-$ may vary from 0.5 volts to 2.5 volts, voltage $V_{mid}$ is preferably at about 1.5 volts. Of course, the particular voltage of midlevel $V_{mid}$ will vary according to the particular application, and according to the particular voltages utilized therein. Further in the alternative, it is contemplated, in the differential switched-capacitor case such as described relative to FIG. 5, that the application of different voltages $V_{mid}^+$, $V_{mid}^-$ to the differential sample nodes $V_A$, $V_B$ may be beneficial.

Switches 40+, 40− are each controlled by precharge clock $\phi_2'$. According to this preferred embodiment of the invention, precharge clock $\phi_2'$ is driven active during an early portion of the active phase of amplify clock $\phi_2$. In this way, during such time as precharge clock $\phi_2'$ is active, both node $V_A$ and also node $V_B$ receive the voltage on line $V_{mid}$. According to the preferred embodiment of the invention, the active phase of precharge clock $\phi_2'$ does not overlap either of the active phases of sample clock $\phi_1$ or reference clock $\phi_2''$, and preferably occurs, in each cycle, after the active phase of sample clock $\phi_1$ and during an initial portion of the active phase of amplify clock $\phi_2$. As will become apparent from the following description, the duration of the active phase of precharge clock $\phi_2'$ need not be selected or maintained with a high degree of precision.

Figure 6:
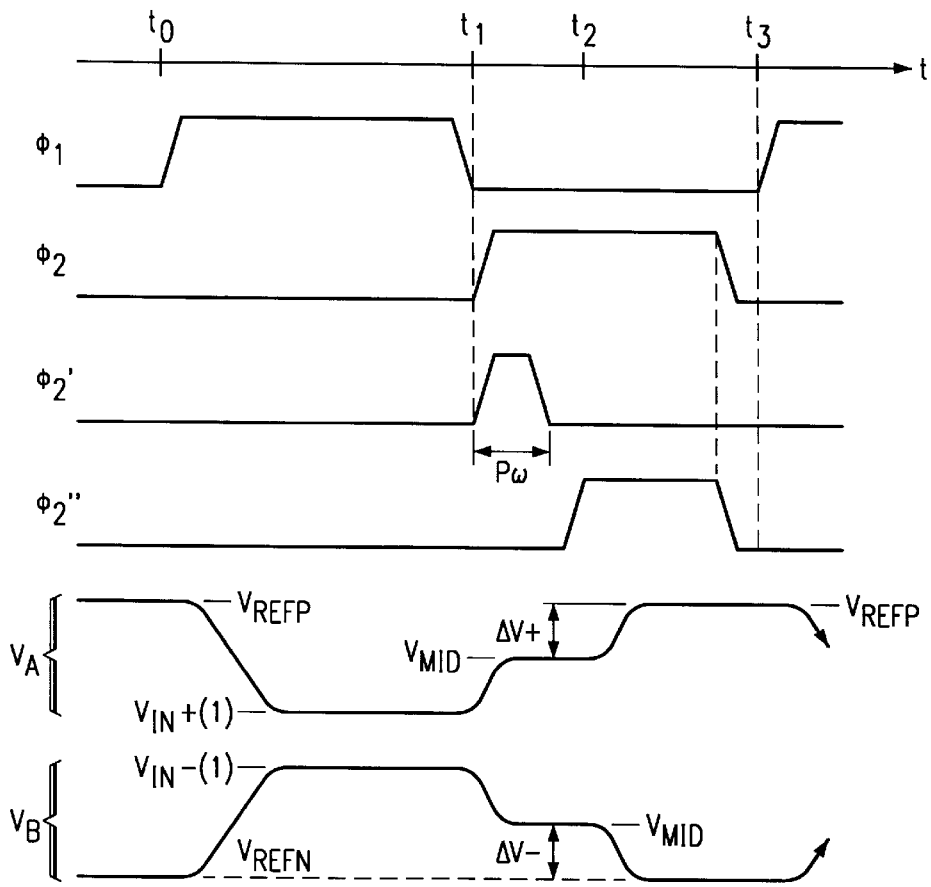
FIG. 6 is a timing diagram illustrating the operation of the differential switched-capacitor stage of FIG. 5, constructed according to the preferred embodiment of the invention.

Referring now to FIG. 6, an example of the operation of switched-capacitor stage $35_j$ will now be described relative to a cycle in which input voltage $V_{in}^+$ is relatively low (near low reference voltage $V_{refn}$) and in which input voltage $V_{in}^-$ is relatively high (near high reference voltage $V_{refp}$). Prior to time $t_0$, node $V_A$ is at high reference voltage $V_{refp}$, while node $V_B$ is at low reference voltage $V_{refn}$; these voltages result from the operation of the previous cycle (as will be apparent from the following description). Briefly prior to time to, all of clocks $\phi_1$, $\phi_2$, $\phi_2'$, $\phi_2''$ are inactive, and as such all switches 37, 38, 39, 40, 41 in stage $35_j$ are open. At time $t_0$, an active phase of sample clock $\phi_1$ begins. At this time, switches 37+, 37−, 38+, 38− in switched-capacitor stage $35_j$ are closed, thus applying input voltage $V_{in}^+$ to node $V_A$ at sample capacitor CIN+ and input voltage $V_{in}^-$ to node $V_B$ at sample capacitor CIN−. Additionally, input voltages $V_{in}^+$, $V_{in}^-$ are applied to feedback capacitors CFB+, CFB−, respectively, through respective switches 38+, 38−. As illustrated in FIG. 6, nodes $V_A$, $V_B$ discharge and charge, respectively, toward their respective input voltages $V_{in}^+$, $V_{in}^-$ after time $t_0$, reaching the level of these input voltages during the active phase of sample clock $\phi_1$. During this time, amplifier 36 begins generating its output at lines $V_{out}^-$, $V_{out}^+$, based on the samples of the input voltages obtained at its inputs via capacitors CIN+, CIN−. After the desired duration, the active phase of sample clock $\phi_1$ ends shortly prior to time ti in the example of FIG. 6, responsive to which switches 37+, 38+, 37−, 38− open.

According to the preferred embodiment of the present invention, amplify clock $\phi_2$ and precharge clock $\phi_2'$ begin active phases at time $t_1$. The active phase amplify clock $\phi_2$ effects amplification via amplifier 36, while the active phase of precharge clock $\phi_2'$ prepares switched-capacitor stage $35_j$ for the next cycle. Specifically, the active phase of amplify clock $\phi_2$ closes switches 41+, 41−, so that feedback from output lines $V_{out}^-$, $V_{out}^+$ are respectively applied to feedback capacitors CFB+, CFB−. During this phase, amplifier 36 continues its amplification operation, generating the appropriate differential voltage at output lines $V_{out}^-$, $V_{out}^+$ according to the sampled differential input voltages $V_{in}^+$, $V_{in}^-$ and according to the negative feedback applied via feedback capacitors CFB+, CFB−.

The transition of precharge clock $\phi_2'$ at time $t_1$ closes switches 40+, 40−, such that voltage $V_{mid}$, which in this case is generated by voltage divider 42, is applied to nodes $V_A$, $V_B$. As illustrated in FIG. 6, the voltages at nodes $V_A$, $V_B$ charge and discharge, respectively, toward voltage $V_{mid}$. According to the preferred embodiment of the invention, the duration PW of the active pulse of precharge clock $\phi_3$ may be quite short, for example on the order of 10 nsec for a 5 MHz application, considering that it is not essential that nodes $V_A$, $V_B$ actually reach voltage $V_{mid}$ in order to provide the benefits of the present invention. Furthermore, as noted above, the specific voltage $V_{mid}$ toward which nodes $V_A$, $V_B$ are driven during the active phase of precharge clock $\phi_3$ is not of critical importance. These relatively loose constraints upon pulse width PW and voltage $V_{mid}$ result from the consideration that switches 40+, 40− and precharge clock $\phi_2'$ are intended simply to bring the voltages at nodes $V_A$, $V_B$ away from the worst case extremes of their opposite states (as in the example of FIG. 6), and toward a voltage that is somewhat within the middle of the expected range of input voltages $V_{in}^+$, $V_{in}^-$. Upon the completion of the active phase of precharge clock $\phi_2'$, prior to time $t_2$, switches 40+, 40− are then opened.

At time $t_2$, reference clock $\phi_2''$ enters its active phase, closing switches 39+, 39− to apply reference voltages $V_{refp}$, $V_{refn}$ to nodes $V_A$, $V_B$, respectively. This closing of switches 39+, 39− charges and discharges nodes $V_A$, $V_B$ to reference voltages $V_{refp}$, $V_{refn}$, respectively, in preparation for the next cycle. Prior to time $t_3$, both amplify clock $\phi_2$ and reference clock $\phi_2''$ return to an inactive state, prior to initiation of the next sample cycle.

It is contemplated, according to the present invention, that the operation of precharge clock $\phi_2'$ in applying voltage $V_{mid}$ to sample nodes $V_A$, $V_B$ will result in significant improvement in the stability of reference voltages $V_{refp}$, $V_{refn}$ over time, primarily by presenting a constant impedance to the circuitry generating the reference voltages. This improvement may be explained by consideration of the distribution of charge between the reference voltage circuit and the sample capacitors of the switched-capacitor stages, as will now be described.

Conventional reference voltage circuits (such as reference voltage circuit 20 of FIG. 3) include large capacitors at their outputs, relative to the sample capacitors $V_A$, $V_B$ of switched-capacitor stages 35. For a given reference voltage $V_{ref}$, one may thus consider a total charge $Q_{TOT}$ as the sum of the charge on the corresponding voltage reference capacitor of capacitance $C_{ref}$ plus the charge on the sample capacitor of capacitance $C_{sample}$. Of course, the charge on a capacitor is simply the product of the capacitance of the capacitor with the voltage thereacross. For an initial condition where a reference voltage $V_{ref}$ is generated but is not yet connected to sample capacitance $C_{sample}$, such that the voltage at the sample capacitor is at a voltage $V_{pre}$, the charge equation corresponds to the following:

$$Q_{TOT} = V_{ref}C_{ref} + V_{pre}C_{sample}$$

Once a switch is closed to apply the reference voltage to the sample node (e.g., switch 19+ of FIG. 3 doses), the voltages across each of the sample and reference capacitors equalize to voltage $V_{fin}$, changing the charge equation to:

$$Q_{TOT} = V_{fin}C_{ref} + V_{fin}C_{sample}$$

Combining these two equations to solve for the voltage $V_{fin}$:

$$V_{fin} = V_{ref}\frac{C_{ref}}{C_{ref} + C_{sample}} + V_{pre}\frac{C_{sample}}{C_{ref} + C_{sample}}$$

Figure 4:
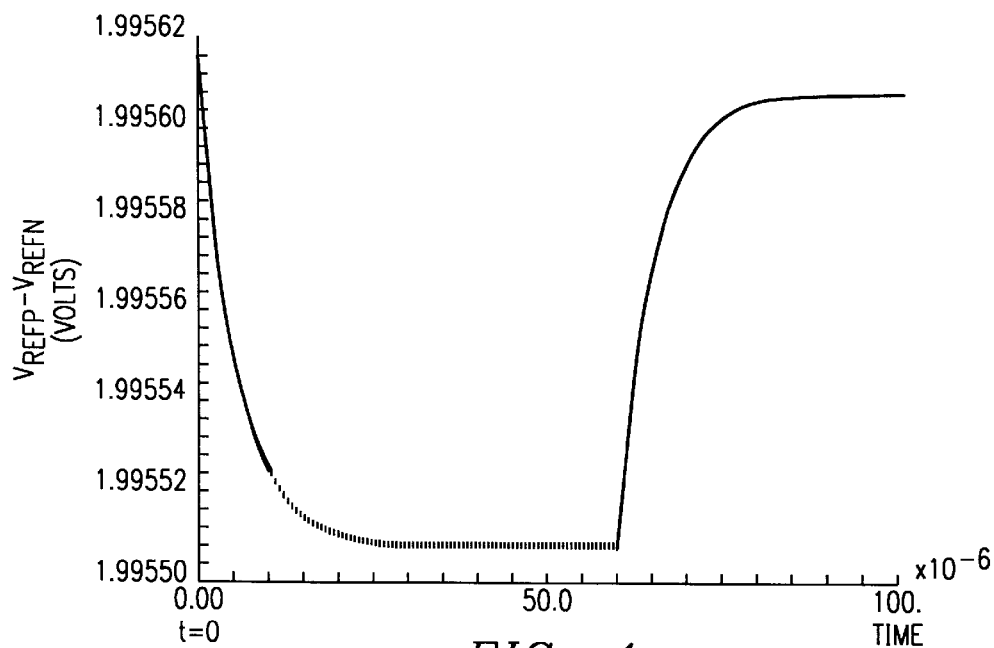
FIG. 4 is a voltage plot over time of a simulation of the operation of the differential switched-capacitor stage of FIG. 3.

Even though, as noted above, the capacitance $C_{sample}$ of the sample capacitor is very small compared to the reference capacitance $C_{ref}$ (e.g., on the order of one thousand times smaller), variations in the initial voltage $V_{pre}$ at the sample capacitor, before the reference voltage is applied thereto, will necessarily result in variations in the final voltage $V_{fin}$ after the reference voltage is applied. These variations are described above, in the worst case, relative to FIG. 4. While quite small in the absolute sense, the variations in the final reference voltage $V_{fin}$ can be quite limiting in some applications of switched-capacitor circuitry, such as high-precision ADCs.

Relative to the above discussion, the present invention is directed to eliminating the variations of the reference voltage by ensuring that sample capacitors CIN+, CIN+ are at the same voltage, in each cycle, immediately prior to the application of reference voltages $V_{refp}$, $V_{refn}$ thereto. As described above, this is accomplished by way of switches 40+, 40− which apply voltage $V_{mid}$ to sample nodes $V_A$, $V_B$ during the active phase of precharge clock $\phi_2'$, prior to the active phase of reference clock $\phi_2''$ as shown in FIG. 6.

Figure 1:
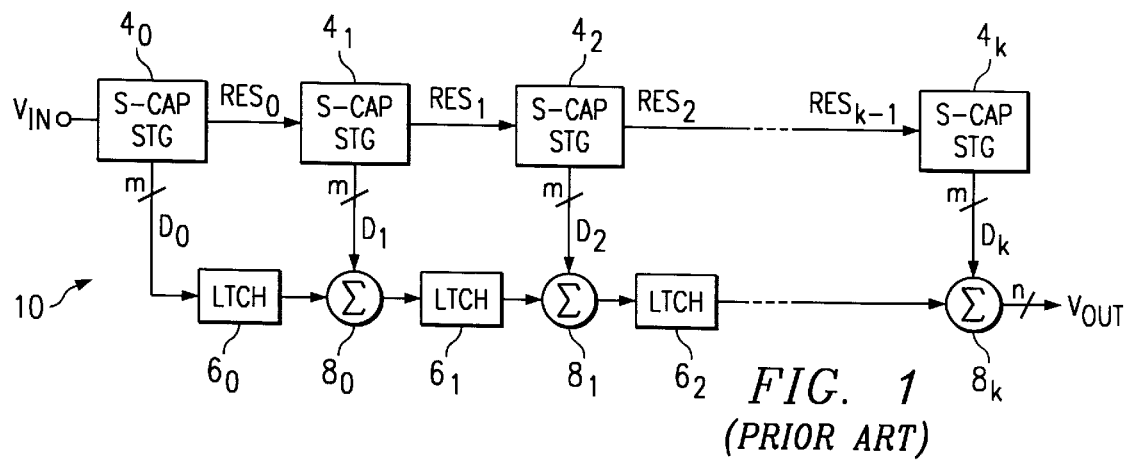
FIG. 1 is an electrical diagram, in block form, of a conventional pipelined analog-to-digital converter (ADC).
Figure 2:
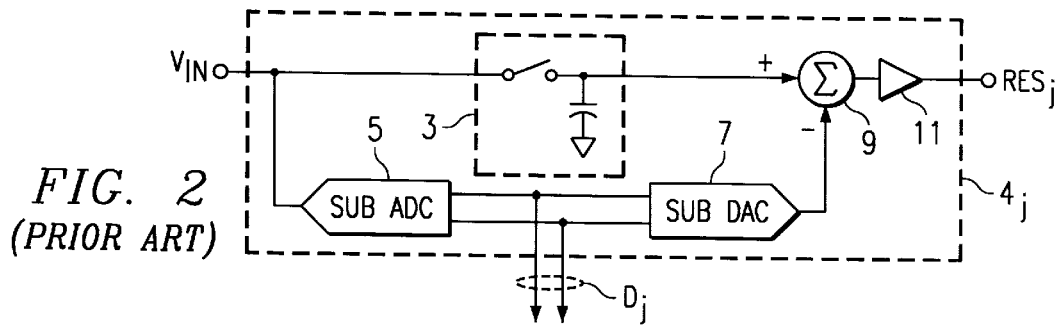
FIG. 2 is an electrical diagram, in block form, of a conventional stage in the pipelined ADC of FIG. 1.
Figure 3:
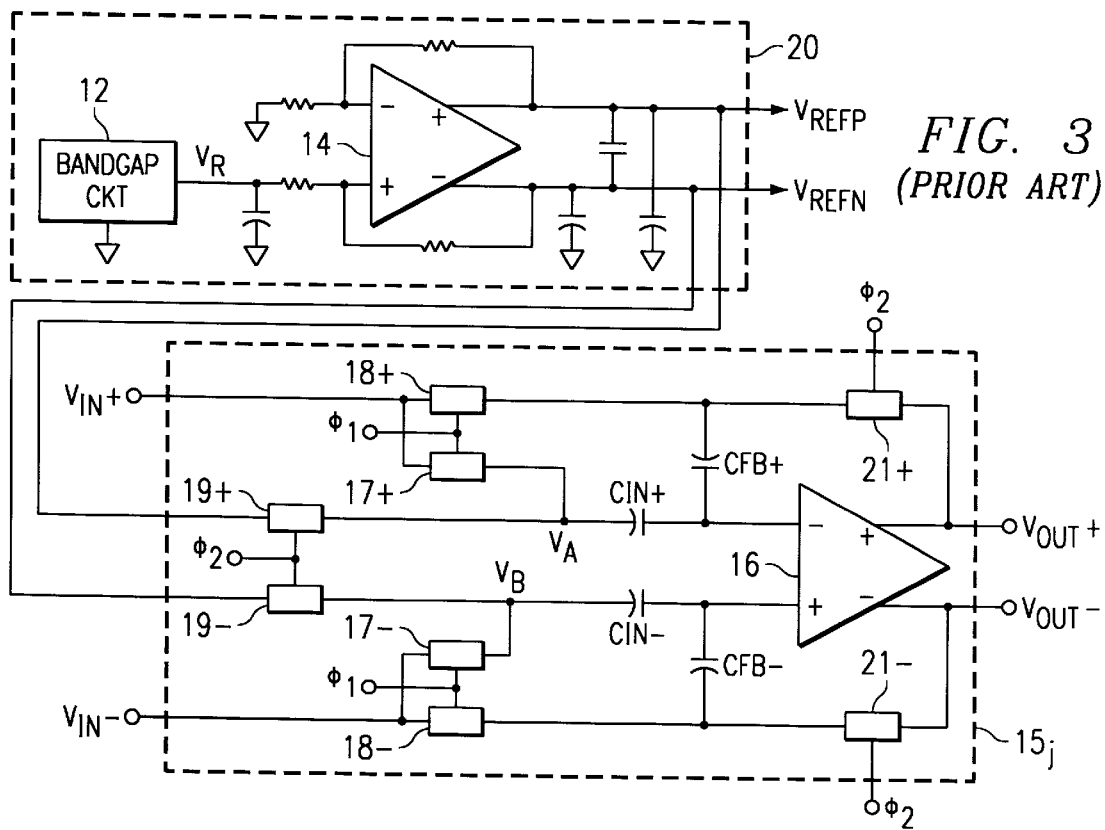
FIG. 3 is an electrical diagram, in schematic form, of a conventional differential switched-capacitor stage, and accompanying voltage reference circuit, such as used in the conventional pipelined ADC of FIG. 1.
Figure 7:
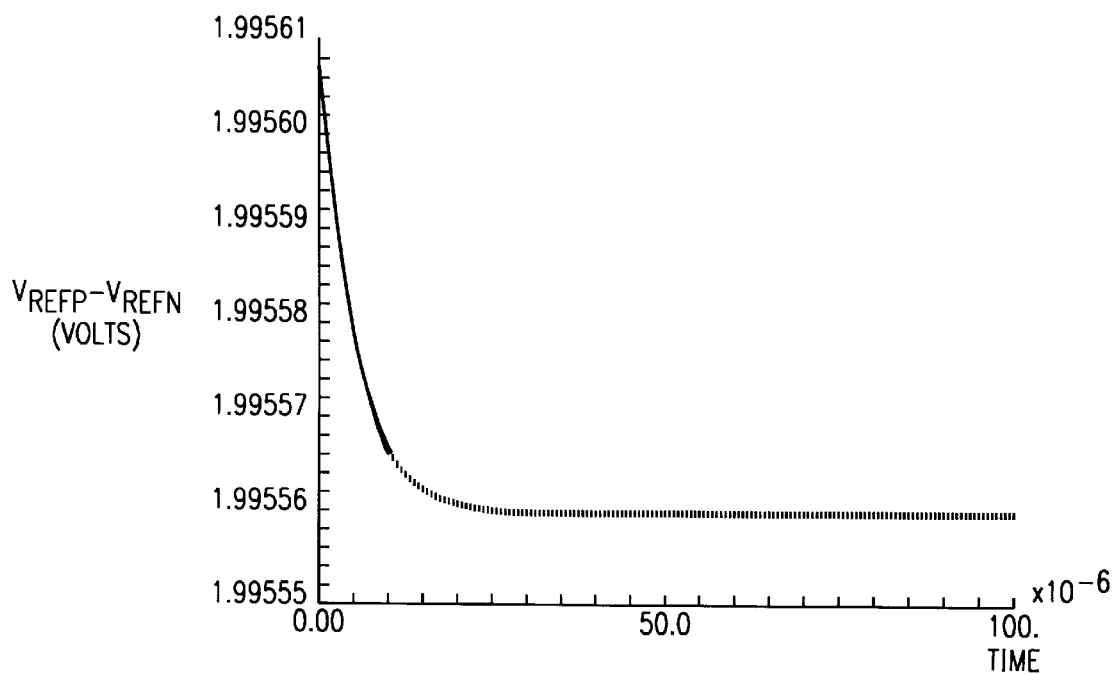
FIG. 7 is a voltage plot over time of a simulation of the operation of the differential switched-capacitor stage of FIG. 5 according to the preferred embodiment of the invention.

Referring now to FIG. 7, a simulation of the operation of switched-capacitor stage $35_j$ according to the preferred embodiment of the invention will now be described, to provide a comparison of the contemplated performance of the present invention relative to the conventional switched-capacitor stage $15_j$ described relative to FIG. 3. In this example, the initial condition of switched-capacitor stage $35_j$ prior to time t=0 is established by simulated operation for several cycles at a clock frequency ($\phi_1$, $\phi_2$, $\phi_2'$, and $\phi_2''$) of 5 MHz using a minimum power supply voltage of 3 volts; for these initializing cycles, input voltage $V_{in}^+$ was set equal to reference voltage $V_{refn}$, and input voltage $V_{in}^-$ was set equal to reference voltage $V_{refp}$, establishing each input voltage at its opposite state. At time t=0, new samples are obtained with input voltage $V_{in}^+$ set equal to reference voltage $V_{refp}$, and input voltage $V_{in}^-$ set equal to reference voltage $V_{refn}$, similarly as in the example of the operation of the conventional switched-capacitor stage $15_j$ illustrated in FIG. 4. As illustrated in FIG. 7 for this simulation, beginning at time t=0, the reference voltage differential $V_{refp} - V_{refn}$ thus modulates to a lower voltage, settling, at about 20 microseconds, to a lower voltage.

However, the reference voltage differential $V_{refp} - V_{refn}$ according to the preferred embodiment of the invention remains stable once it has settled. Similarly as in the simulation illustrated relative to FIG. 4, switched-capacitor stage $35_j$, the simulation illustrated in FIG. 7 reverted the input voltages to their initial state, with input voltage $V_{in}^+$ set equal to reference voltage $V_{refn}$, and input voltage $V_{in}^-$ set equal to reference voltage $V_{refp}$, again occurring at about 60 μsec after time t=0. As evident from FIG. 7, the reference voltage differential $V_{refp} - V_{refn}$ remains at this lower voltage despite this switching operation, because of the application of voltage $V_{mid}$ to sample nodes $V_A$, $V_B$ as described above. As such, the variation of the reference voltage differential $V_{refp} - V_{refn}$ as a result of switching of the switched-capacitor input stages is greatly reduced through implementation of the preferred embodiment of the invention, with variations of less than 10 μvolts, after 40 cycles at 5 MHz, as evident in FIG. 7. This stability is desired in many applications, especially in pipelined ADCs as will now be described relative to FIG. 8.

Figure 8:
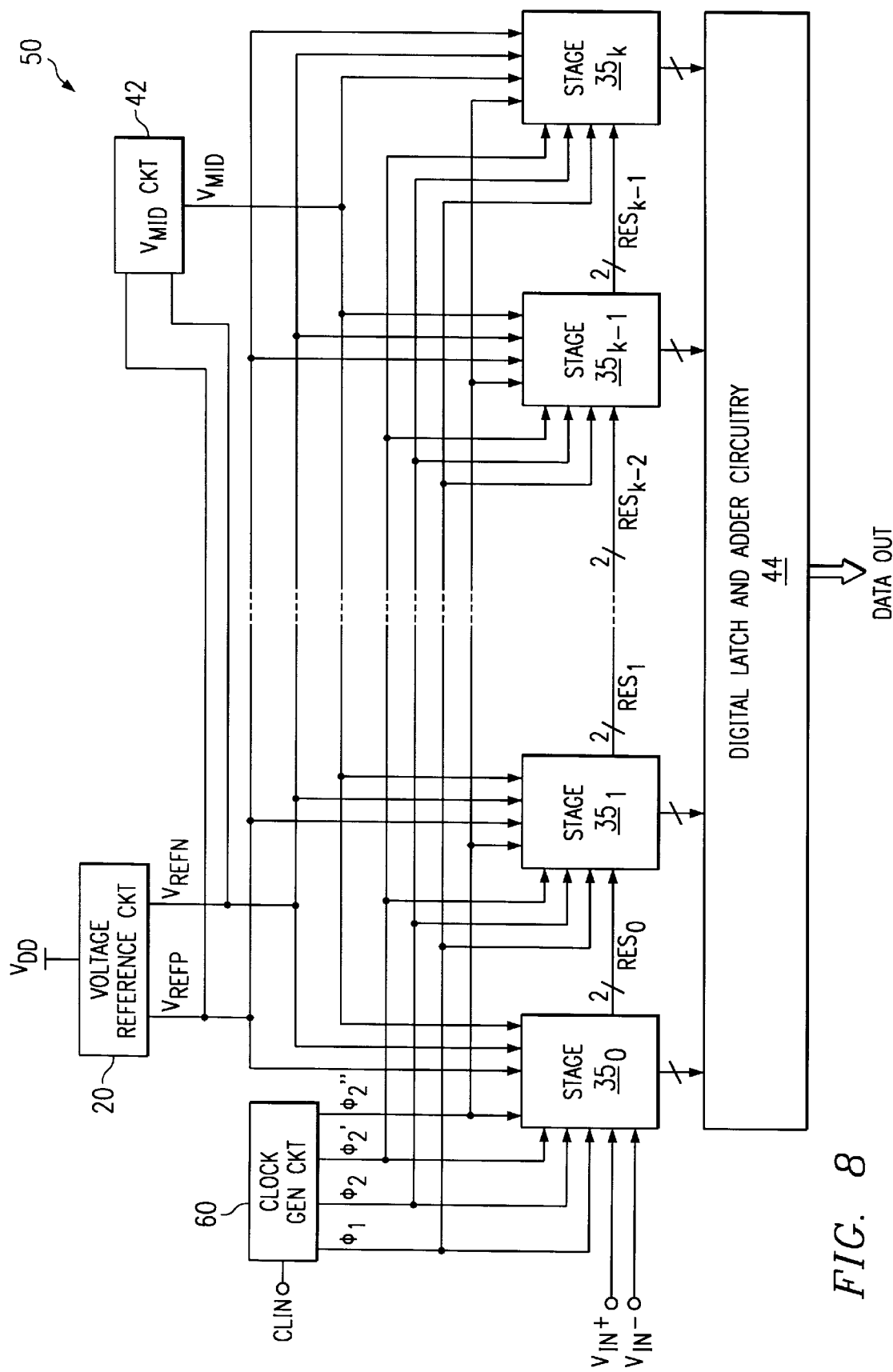
FIG. 8 is an electrical diagram, in block form, of a pipelined ADC incorporating the differential switched-capacitor stage of FIG. 5 according to the preferred embodiment of the invention.

FIG. 8 illustrates pipelined ADC 50, constructed according to the preferred embodiment of the present invention and as such including a series of switched-capacitor stages $35_0$ through $35_k$, constructed as described hereinabove relative to FIG. 5. As illustrated in FIG. 8, switched-capacitor stages 35 are all associated with a digital latch and adder circuitry 44, which carries out the necessary digitization of the results of the switched-capacitor stages 35. In this regard, switched-capacitor stage $35_0$ receives a differential voltage on lines $V_{IN}^+$ and $V_{IN}^-$. In response, switched-capacitor stage $35_0$ generates output that is applied to digital latch and adder circuitry 44; switched-capacitor stage $35_0$ also generates a differential residue signal on lines $RES_0$, which corresponds to an analog remainder from the digitization operation for this stage, amplified to voltage levels suitable for operation by the next combination of switched-capacitor stage $35_1$ to which lines $RES_0$ are applied as shown in FIG. 8.

Switched-capacitor stage $35_1$ then, in turn, generates a digital output that is applied to digital latch and adder circuitry 44, along with a residue signal on lines $RES_1$ for application to the next stage $35_2$ (not shown). This sequence of stages 35 continues, as shown in FIG. 8, through $k^{th}$ switched-capacitor stage $35_k$; switched-capacitor stage $35_k$ produces no residue signal, as no further stages are present in ADC 50. Digital latch and adder circuitry 44 produces, in a pipelined fashion, a digital output of pipelined ADC 50 on bus DATA OUT. In modern pipelined ADCs, such as those generating a digital output of n-bit precision (where n may be 14, 16, or higher), it is contemplated that the number k+1 of switched-capacitor stages 35 can number up to as many as $n_{31}$ 1 (i.e., fifteen or more such stages 35).

Clock generation circuitry 60 is also provided in pipelined ADC 50 according to the preferred embodiment of the invention, and is constructed according to conventional clock circuit techniques to generate, from an external clock signal or crystal oscillator connected to line CLIN, non-overlapping phases of sample clock $\phi_1$, amplify clock $\phi_2$, precharge clock $\phi_2'$, and reference clock $\phi_2''$ for application to each of switched-capacitor stages $35_0$ through $35_k$. The relative timing of the active phases of sample clock $\phi_1$, amplify clock $\phi_2$, precharge clock $\phi_2'$, and reference clock $\phi_2''$, in this preferred embodiment of the invention, correspond to that described above relative to FIG. 6.

Also as illustrated in FIG. 8, pipelined ADC 50 includes voltage reference circuit 20, which may be constructed in the manner described hereinabove relative to FIG. 3. Voltage reference circuit 20 generates reference voltages $V_{refp}$, $V_{refn}$ and applies these voltages, in parallel, to each of switched-capacitor stages $35_0$ through $35_k$. Voltage reference circuit 20 also applies reference voltages $V_{refp}$, $V_{refn}$ to voltage divider 42, which in turn generates voltage $V_{mid}$ that is applied to each of switched-capacitor stages $35_0$ through $35_k$. Considering that each of switched-capacitor stages $35_0$ through $35_k$ receive reference voltages $V_{refp}$, $V_{refn}$ in parallel, and are clocked simultaneously by sample clock $\phi_1$, amplify clock $\phi_2$, precharge clock $\phi_2'$, and reference clock $\phi_2''$, voltage reference circuit 20 is presented with a cumulative load due to the switching at the respective sample-and-hold capacitors CIN+, CIN− of each switched-capacitor stages $35_0$ through $35_k$. According to the preferred embodiment of the invention described hereinabove, however, in which each of switched-capacitor stages $35_0$ through $35_k$ applies voltage $V_{mid}$ to its sample-and-hold capacitors CIN+, CIN− under the control of precharge clock $\phi_2'$, a constant impedance is presented to voltage reference circuit 20 over time, resulting in much improved stability of reference voltages $V_{refp}$, $V_{refn}$ over the switching operation of ADC 50. This improved stability, as noted above, enables the implementation of additional bits of precision in the analog-to-digital conversion by way of pipelined ADCs, and thus additional usability of digital techniques for processing of analog signals.

As described above relative to FIG. 8, many circuit applications of the present invention such as ADC 50 will implement several to many switched-capacitor stages, each of which utilize reference voltages generated from an on-chip reference voltage circuit. In the operation of such applications, it is contemplated that the stabilization of reference voltages may require many cycles. For example, the simulation of switched-capacitor stage $35_j$ arranged according to the preferred embodiment of the invention has determined that the reference voltages applied thereto can stabilize, after operation for 40 cycles, to an accuracy of less than 10 microvolts. The actual reference voltage stability has been found to depend upon the latency that can be afforded in executing the sample, hold, and amplify operations. Considering that high-resolution pipelined ADCs, such as the example of ADC 50 described above, generally require many cycles for proper operation, such latency can often be afforded, especially with improved precision as a benefit.

According to the present invention, therefore switched-capacitor circuits may be constructed to operate at relatively high frequencies, but with minimal loading upon reference voltages applied thereto, such that the stability of the reference voltage is greatly improved, even in integrated circuits in which several to many switched-capacitor circuits each receive the reference voltages, and are simultaneously switched. The present invention is thus contemplated to provide important benefits, particularly in enabling precision functionality of modern high performance circuits, such as pipelined analog-to-digital converters.

While the present invention has been described according to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

I claim:

1. A switched-capacitor circuit, comprising:
an amplifier, having a first input and a first output;
a first sample capacitor, having a first plate coupled to the first input of the amplifier, and having a second plate at a first sample node;
a first signal input switch coupled between a first signal input and the first sample node, the first signal input switch coupled to receive a first clock signal;
a first reference input switch coupled between a first reference voltage input and the first sample node, the first reference input switch coupled to receive a second clock signal;
a first precharge switch, coupled between a precharge voltage and the first sample node, the first precharge switch coupled to receive a precharge clock signal; and
a first feedback network coupled between the first output of the amplifier and the first input of the amplifier.

2. The switched-capacitor circuit of claim 1, further comprising:
a voltage reference circuit for generating the first reference voltage.

3. A switched-capacitor circuit, comprising:
an amplifier, having a first input and a first output;
a first sample capacitor, having a first plate coupled to the first input of the amplifier, and having a second plate at a first sample node;
a first signal input switch coupled between a first signal input and the first sample node, the first signal input switch coupled to receive a first clock signal;
a first reference input switch coupled between a first reference voltage input and the first sample node, the first reference input switch coupled to receive a second clock signal;
a first precharge switch, coupled between a precharge voltage and the first sample node, the first precharge switch coupled to receive a precharge clock signal;
a first feedback network coupled between the first output of the amplifier and the first input of the amplifier; and
a voltage reference circuit for generating the first reference voltage;
wherein the first input voltage varies within a range of voltages between first and second extremes;
wherein the first reference voltage is at a voltage near the first extreme of the range of voltages;
and further comprising:
a precharge voltage generation circuit, for generating the precharge voltage at a voltage approximately midway between the first reference voltage and the second extreme of the range of input voltages.

4. The switched-capacitor circuit of claim 1, further comprising:
a clock generator circuit, for generating the first and second clock signals, and the precharge clock signal, in such a manner that active phases of the first and second clock signals and the precharge clock signal do not overlap one another in time.

5. The switched-capacitor of claim 1, wherein the first feedback network comprises:
a first feedback capacitor having a first plate coupled to the first input of the amplifier, and having a second plate;
a first reference feedback switch coupled between the first reference voltage input and the second plate of the feedback capacitor, and controlled by the first clock signal; and a first output feedback switch coupled between the first output of the amplifier and the second plate of the feedback capacitor, and controlled by an amplify clock signal.

6. The switched-capacitor circuit of claim 1, wherein the amplifier also has a second input and a second output, the first and second inputs of the amplifier corresponding to a differential input, and the first and second outputs of the amplifier corresponding to differential output;

and further comprising:
  a second sample capacitor, having a first plate coupled to the second input of the amplifier, and having a second plate at a second sample node;
  a second signal input switch coupled between a second signal input and the second sample node, the second signal input switch coupled to receive the first clock signal;
  a second reference input switch coupled between a second reference voltage input and the second sample node, the second reference input switch coupled to receive the second clock signal; and
  a second precharge switch, coupled between a precharge voltage and the sample node, the second precharge switch coupled to receive the precharge clock signal.

7. The switched-capacitor circuit of claim 6, wherein the first and second precharge switches are coupled to the same precharge voltage.

8. The switched-capacitor circuit of claim 6, further comprising:
  a voltage reference circuit for generating the first and second reference voltages.

9. The switched-capacitor circuit of claim 8, further comprising:
  a precharge voltage generation circuit, for generating the precharge voltage at a voltage approximately midway between the first and second reference voltages.

10. The switched-capacitor circuit of claim 6, further comprising:
  a clock generator circuit, for generating the first and second clock signals, and the precharge clock signal, in such a manner that active phases of the first and second clock signals and the precharge clock signal do not overlap one another in time.

11. The switched-capacitor of claim 6, wherein the first feedback network comprises:
  a first feedback capacitor having a first plate coupled to the first input of the amplifier, and having a second plate;
  a first reference feedback switch coupled between the first reference voltage input and the second plate of the first feedback capacitor, and controlled by the first clock signal; and
  a first output feedback switch coupled between the first output of the amplifier and the second plate of the first feedback capacitor, and controlled by an amplify clock signal;

and wherein the second feedback network comprises:
  a second feedback capacitor having a first plate coupled to the second input of the amplifier, and having a second plate;
  a second reference feedback switch coupled between the second reference voltage input and the second plate of the second feedback capacitor, and controlled by the first clock signal; and
  a second output feedback switch coupled between the second output of the amplifier and the second plate of the second feedback capacitor, and controlled by the amplify clock signal.

12. An analog-to-digital converter, comprising:
  a clock generator circuit, for generating first and second clock signals, and a precharge clock signal, in such a manner that active phases of the first and second clock signals and the precharge clock signal do not overlap one another in time;
  a voltage reference circuit for generating a first reference voltage;
  a plurality of switched-capacitor stages, connected in a series between an analog input and a digital output, each comprising:
    an amplifier, having a first input and a first output;
    a first sample capacitor, having a first plate coupled to the first input of the amplifier, and having a second plate at a first sample node;
    a first signal input switch coupled between a first signal input and the first sample node, the first signal input switch coupled to receive the first clock signal;
    a first reference input switch coupled between the first reference voltage input and the first sample node, the first reference input switch coupled to receive the second clock signal;
    a first precharge switch, coupled between a precharge voltage and the first sample node, the first precharge switch coupled to receive the precharge clock signal; and
    a first feedback network coupled between the first output of the amplifier and the first input of the amplifier;
  wherein a first one of the plurality of switched-capacitor stages has its first signal input coupled to the analog input;
  and wherein the first signal input of each of the plurality of switched-capacitor stages other than the first one of the plurality of switched-capacitor stages is coupled to an output of an adjacent one of the plurality of switched-capacitor stages in the series.

13. The analog-to-digital converter of claim 12, wherein the amplifier in each of the plurality of switched-capacitor stages also has a second input and a second output, the first and second inputs of the amplifier corresponding to a differential input, and the first and second outputs of the amplifier corresponding to differential output;
  wherein the voltage reference circuit is also for generating a second reference voltage
  and wherein each of the plurality of switched-capacitor stages further comprises:
    a second sample capacitor, having a first plate coupled to the second input of the amplifier, and having a second plate at a second sample node;
    a second signal input switch coupled between a second signal input and the second sample node, the second signal input switch coupled to receive the first clock signal;
    a second reference input switch coupled between the second reference voltage input and the second sample node, the second reference input switch coupled to receive the second clock signal;
    a second precharge switch, coupled between a precharge voltage and the second sample node, the second precharge switch coupled to receive the precharge clock signal; and
    a second feedback network coupled between the second output of the amplifier and the second input of the amplifier.

14. The analog-to-digital converter of claim 13, further comprising:
- a precharge voltage generation circuit, for generating the precharge voltage at a voltage approximately midway between the first and second reference voltages.

15. The analog-to-digital converter of claim 13, wherein the first feedback network in each of the plurality of switched-capacitor stages comprises:
- a first feedback capacitor having a first plate coupled to the first input of the amplifier, and having a second plate;
- a first reference feedback switch coupled between the first reference voltage input and the second plate of the first feedback capacitor, and controlled by the first clock signal; and
- a first output feedback switch coupled between the first output of the amplifier and the second plate of the first feedback capacitor, and controlled by an amplify clock signal;

and wherein the second feedback network in each of the plurality of switched-capacitor stages comprises:
- a second feedback capacitor having a first plate coupled to the second input of the amplifier, and having a second plate;
- a second reference feedback switch coupled between the second reference voltage input and the second plate of the second feedback capacitor, and controlled by the first clock signal; and
- a second output feedback switch coupled between the second output of the amplifier and the second plate of the second feedback capacitor, and controlled by the amplify clock signal.

16. A method of operating a switched-capacitor circuit, the switched-capacitor circuit including an amplifier having a first input for receiving a first input voltage varying within a range of voltages between first and second extremes, and having a first output coupled to the first input by way of a first feedback network, the method comprising the steps of:
- closing a first input switch for a selected duration to couple a first input voltage to a first sample node at one plate of a first sample-and-hold capacitor, the first sample-and-hold capacitor having a second plate coupled to the first input of the amplifier;
- after the step of closing the first input switch, closing a first precharge switch for a selected duration to apply a precharge voltage to the first sample node; and
- after the step of closing the first precharge switch, closing a first reference input switch for a selected duration to apply a first reference voltage to the first sample node, the first reference voltage being near the first extreme of the range of voltages;
- wherein the first reference voltage is at a voltage between the first reference voltage and the second extreme of range of voltages.

17. The method of claim 16, wherein the step of closing the first input switch comprises applying an active phase of a first clock signal to the first input switch;
- wherein the step of closing the first precharge switch comprises applying an active phase of a precharge clock signal to the first precharge switch;
- wherein the step of closing the first reference input switch comprises applying an active phase of a second clock signal to the first reference input switch;
- and wherein the active phases of the first clock signal, second clock signal, and precharge clock signal, are non-overlapping relative to one another.

18. The method of claim 17, wherein the first feedback network comprises:
- a first feedback capacitor having a first plate coupled to the first input of the amplifier, and having a second plate;
- a first reference feedback switch coupled between the first reference voltage input and the second plate of the first feedback capacitor; and
- a first output feedback switch coupled between the first output of the amplifier and the second plate of the first feedback capacitor;
- wherein the step of applying an active phase of a first clock signal to the first input switch further comprises applying an active phase of an amplify clock signal to the first reference feedback switch;
- and wherein the step of applying an active phase of a second clock signal to the first reference input switch further comprises applying an active phase of the amplify clock signal to the first output feedback switch.

19. The method of claim 16, wherein the amplifier also has a second input and a second output, so that the first and second inputs of the amplifier correspond to a differential input and the first and second outputs of the amplifier correspond to a differential output;

and wherein the method further comprises:
- during the step of closing the first input switch, closing a second input switch for the selected duration to couple a second input voltage to a second sample node at one plate of a second sample-and-hold capacitor, the second sample-and-hold capacitor having a second plate coupled to the second input of the amplifier;
- during the step of closing the first precharge switch, closing a second precharge switch for the selected duration to apply the precharge voltage to the second sample node; and
- during the step of closing the first reference input switch, closing a second reference input switch for the selected duration to apply a second reference voltage to the second sample node.

20. The method of claim 18, wherein the steps of closing the first and second input switches comprise simultaneously applying an active phase of a first clock signal to the first and second input switches;
- wherein the steps of closing the first and second precharge switches comprise simultaneously applying an active phase of a precharge clock signal to the first and second precharge switches;
- wherein the steps of closing the first and second reference input switches comprise simultaneously applying an active phase of a second clock signal to the first and second reference input switches;
- and wherein the active phases of the first clock signal, second clock signal, and precharge clock signal, are non-overlapping relative to one another.

* * * * *